United States Patent [19]

Seki

[11] Patent Number: 4,901,124
[45] Date of Patent: Feb. 13, 1990

[54] CONDUCTIVITY MODULATED MOSFET
[75] Inventor: Yasukazu Seki, Kawasaki, Japan
[73] Assignee: Fuji Electric Co., Ltd., Kawasaki, Japan
[21] Appl. No.: 339,814
[22] Filed: Apr. 18, 1989
[30] Foreign Application Priority Data Apr. 22, 1988 [JP] Japan .................. 63-99473

[51] Int. Cl.[4] .......................................... H01L 29/78
[52] U.S. Cl. .................. 357/23.4; 357/23.13; 357/42; 357/43; 357/59
[58] Field of Search .............. 357/23.13, 43, 42, 59 E, 357/59 G, 59 I, 23.4, 59 H

[56] References Cited

U.S. PATENT DOCUMENTS

| 4,072,975 | 2/1978 | Ishitani | 357/23 |
| 4,633,438 | 12/1986 | Kame et al. | 365/51 |
| 4,646,123 | 2/1987 | Lynch et al. | 357/42 |
| 4,670,768 | 6/1987 | Sunami et al. | 357/42 |
| 4,797,724 | 1/1989 | Boles et al. | 357/42 |
| 4,799,095 | 1/1989 | Baliga | 357/38 |
| 4,823,172 | 4/1989 | Mihara | 357/15 |
| 4,831,424 | 5/1989 | Yoshida et al. | 357/23.13 |

FOREIGN PATENT DOCUMENTS 57-93652 10/1982 Japan .

OTHER PUBLICATIONS

Nakagawa, "Safe Operating Area for 1200-V Non-latchup Bipolar-Mode MOSFET's", Transactions on Electron Drvices, vol. ED-34, No. 2, Feb. 87.

Primary Examiner—Martin H. Edlow
Assistant Examiner—Stephen D. Meier
Attorney, Agent, or Firm—Spencer & Frank

[57] ABSTRACT

A conductivity modulated MOSFET is composed of a MOSFET formed according to SOI technique utilizing two polycrystalline silicon layers deposited on a semiconductor substrate through an oxide film, and a vertical bipolar transistor formed within the semiconductor substrate. Therefore, electrons and positive holes pass through different passages respectively, and any parasitic thyristor is not formed as in the conventional conductivity modulated MOSFET with a MOSFET built in the semiconductor substrate, and thus there is no possibility of causing the latch up phenomenon.

1 Claim, 2 Drawing Sheets

CONDUCTIVITY MODULATED MOSFET

BACKGROUND OF THE INVENTION

1. Field of the Invention

The present invention relates to a conductivity modulated MOSFET which makes use of bipolar operation, and more particularly to a conductivity modulated MOSFET which does not cause latch up phenomenon and which can pass a high electric current therethrough.

2. Description of the Prior Art

There have been proposed a variety of conductivity modulated MOSFET. In this respect, a reference can be made to U.S. Pat. No. 4,072,975. In general, a conductivity modulated MOSFET composed of N-channel MOSFET has a structure depicted in FIG. 1. Its principal structure comprises a source electrode 1, a gate electrode 2, a drain electrode 3, an $N^-$ base layer 4, a $P^+$ layer 5, a P base layer 6, a $p^+$ drain layer 7, an $N^+$ source layer 8, a gate polycrystalline silicon layer 9, a gate oxide film 10, and a phospho-silicate-glass (hereinafter referred to as "PSG") insulating layer 11. A source terminal S is connected to the source electrode 1, a gate terminal G is connected to the gate electrode 2, and a drain terminal D is connected to the drain electrode 3.

If a voltage not less than a predetermined threshold value is applied between the source electrode 1 and the gate electrode 2, a surface of the P base layer 6 beneath the gate polycrystalline silicon layer 9 causes inversion to form a channel for electrons, and as a result, the source and the drain are converted to conductive states. If the electrons which migrate into the $N^-$ base layer 4 through this channel reach the $P^+$ drain layer 7, positive holes injection of the $N^-$ base layer 4 is caused. A conductivity of the $N^-$ base layer 4 is modulated according to this positive holes injection, and the conductivity is extremely increased. As a result, a high electric current can be passed through the device. One of important advantages of the device is that the electric current becomes 10 to 20 times that of the conventional vertical type power MOSFET which is not provided with any $P^+$ drain layer 7.

The operations of the aforementioned device will hereinafter be explained with reference to FIG. 2 which illustrates an equivalent circuit of the device having the structure shown in FIG. 1. The circuit comprises, in addition to an MOSFET 31, a base shunting resistor Rp, a PNP transistor 32, and an NPN transistor 33. The PNP transistor 32 consists of the P base layer 6, the $N^-$ base layer 4, and the $P^+$ drain layer 7 shown in FIG. 1, while the NPN transistor 33 consists of the $N^+$ source layer 8, the P base layer 6 and the $N^-$ base layer 4. Above-mentioned "base shunting resistor Rp" means the resistance observed when the P base layer 6 and the $P^+$ layer 5 are connected to the source electrode in series. When a voltage not less than the threshold value is applied to the gate to let the MOSFET 31 turns to on-state, and electrons derived from the source migrate into the base of the PNP transistor 32, and as a result, the device is put in on-state operation.

The conductivity modulated vertical MOSFET exhibits an advantage such that the device makes it possible to pass a large electric current therethrough. However, as will be apparent from FIG. 2, it suffers from a disadvantage such that the device accompanies a latch up phenomenon derived from a parasitic thyristor formed by the NPN transistor 33 and the PNP transistor 32. In other words, since a voltage drop access the base shunting resistor Rp is small in the region the electric current between the source and drain is low, only a limited strength of electric current can pass through the NPN transistor 33, and thus the electric current can pass through only the PNP transistor 32. As the gate voltage applied to the MOSFET 31 is increased, the voltage drop across the base shunting resistor Rp increases, and finally the parasitic thyristor becomes on-state. At this stage, the electric current is spontaneously latched by the parasitic thyristor portion without supplying the gate voltage for the MOSFET 31. Therefore, the main electric current cannot be shut-off. This state is referred to as "latch up phenomenon", and the maximum value of electric current to be passed through a vertical MOSFET is limited due to the latch up phenomenon.

The latch up phenomenon is likely to occur during turn off immediately after shutting off the gate voltage. In other words, the electrons flowing from the MOSFET 31 to the base of the MOSFET 32 are suddenly stopped when the MOSFET 31 shown in FIG. 2 is in off-state. Thus, electrons which are recombined within the base run out, and as a result, a large amount of positive holes migrate through the base shunting resistor Rp without recombination with electrons. For this reason, the parasitic thyristor is likely to operate.

Upon switching off the conductivity modulated MOSFET or during the turn off state thereof, the latch up phenomenon is easily caused, which makes it difficult to shorten the turn off time. This is a severe disadvantage of the conductivity modulated MOSFET encountered when the device is used as a switching device.

SUMMARY OF THE INVENTION

An object of the present invention is to provide a conductivity modulated MOSFET which does not suffer from the foregoing disadvantages accompanied by the conventional ones, which makes it possible to prevent the latch up phenomenon due to the parasitic thyristor and which makes it possible to pass a high electric current therethrough.

The present invention provides a conductivity modulated metal oxide semiconductor field effect transistor, comprising:

a semiconductor substrate having a base layer of first conductivity type, a drain layer of second conductivity type formed on a first surface of the base layer, and an emitter region of the second conductivity type formed on a second surface of the base layer;

an oxide film deposited on the substrate so that it spans over a part of a surface of the emitter region and a part of a surface of the base layer;

a first polycrystalline silicon layer of the second conductivity type deposited so that it comes into contact with only the oxide film;

a second polycrystalline silicon layer of the first conductivity type deposited so that it spans over the emitter region and the oxide film, and so that it comes into contact with a first side wall of the first polycrystalline silicon layer;

a third polycrystalline silicon layer of the first conductivity type deposited so that it spans over the base region and the oxide film, and so that it comes into contact with a second side wall of the first polycrystalline silicon layer;

a gate polycrystalline silicon layer deposited so that it spans over from the first polycrystalline silicon layer to the third polycrystalline silicon layer through an insulating layer;

a source electrode coming into contact with the emitter region and the second polycrystalline silicon layer;

a gate electrode coming into contact with the gate polycrystalline silicon layer; and a drain electrode coming into contact with the drain layer.

According to the present invention, the conductivity modulated MOSFET is composed of a MOSFET formed according to SOI technique utilizing two polycrystalline silicon layers deposited on a semiconductor substrate through an oxide film, and a vertical bipolar transistor formed within the semiconductor substrate. Therefore, electrons and positive holes pass through different passages respectively, and any parasitic thyristor is not formed as in the conventional conductivity modulated MOSFET with a MOSFET built in the semiconductor substrate, and thus there is no possibility of causing the latch up phenomenon.

The above and other objects, effects, features, and advantages of the present invention will become more apparent from the following description of embodiments thereof, taken in conjunction with the accompanying drawings.

DETAILED DESCRIPTION OF PREFERRED EMBODIMENTS

Figure 1:
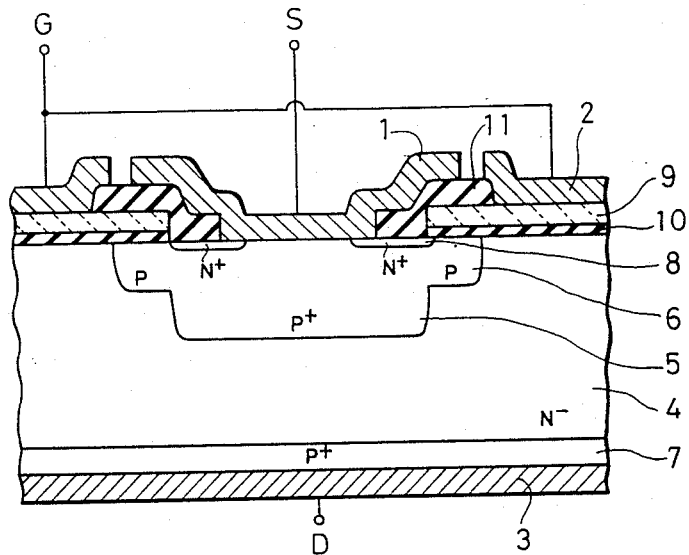
FIG. 1 is a cross-sectional view of a conventional conductivity modulated MOSFET.
Figure 2:
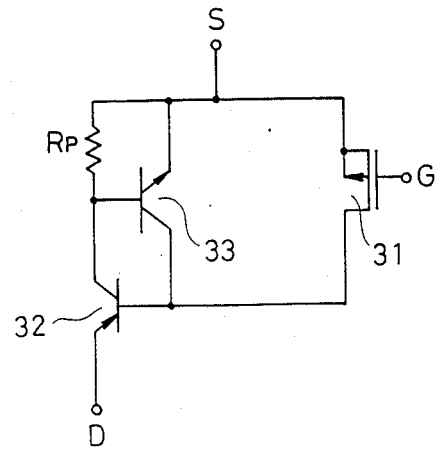
FIG. 2 is an equivalent circuit of the device shown in FIG. 1.
Figure 3:
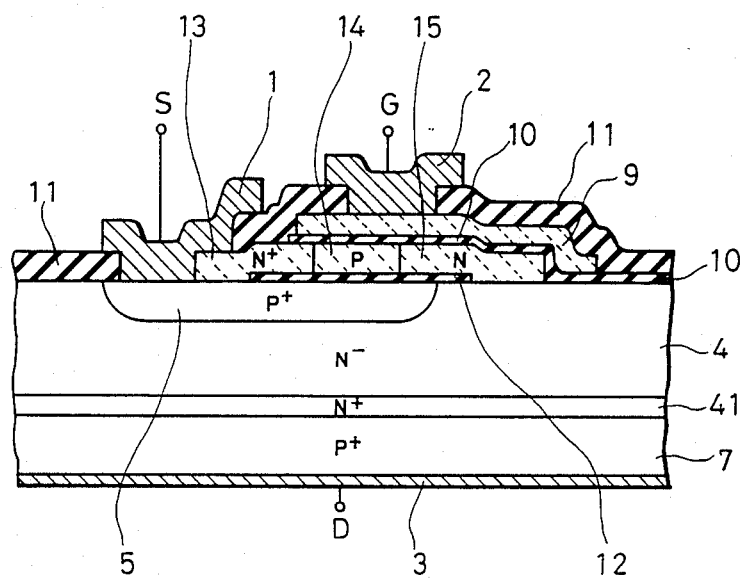
FIG. 3 is a cross-sectional view of the preferred embodiment of the present invention.

FIG. 3 is a cross-sectional view of an embodiment according to the present invention. In this figure, the same numerical values as in FIG. 1 are assigned to the parts common to those shown in FIG. 1. In this embodiment, there is only a vertical type PNP bipolar transistor in a silicon substrate. Namely, the vertical type PNP bipolar transistor comprises a P+ drain layer 7 adjacent to the underside of an N− base layer 4 through an N+ buffer layer 41, and a P+ emitter region 5 formed within a part of the upper surface of the N− base layer 4. The PNP bipolar transistor corresponds to the PNP transistor 32 in the equivalent circuit shown in FIG. 2.

An oxide film 12 formed on the upper surface of the silicon substrate is selectively etched so as to leave a part thereof. Then, an undoped polycrystalline silicon layer is deposited at an thickness of 0.5 to 1 micron at 600° C. according to low pressure chemical vapor deposition (CVD) technique, so that the oxide film 12 is completely covered. Thereafter, impurity atoms such as boron or phosphorus are selectively diffused in the polycrystalline silicon layer using ion injection technique. Thus, above-mentioned polycrystalline silicon layer is converted to an N+ polycrystalline silicon layer 13 which spans over the oxide film 12 and the P+ emitter region 5, an N polycrystalline silicon layer 15 which spans over the oxide film 12 and the base N− base layer 4, and P polycrystalline silicon layer 14 which is insulated from the P+ emitter layer 5 through the oxide film 12.

Then, a doped gate polycrystalline silicon layer 9 is deposited through a gate oxide film 10 which has been formed by thermal oxidation technique. Moreover, a source electrode 1 which contacts with both the P+ emitter region 5 and the N+ polycrystalline silicon layer 13, and a gate electrode 2 which contacts with the gate polycrystalline silicon layer 9 are formed at an aperture of PSG insulating layer 11 which covers the surface of the device. In addition, a drain electrode 3 is formed so that it contacts with the P+ drain layer 7.

The manufacturing processes mentioned above are summarized as follows.

(1) First of all, a semiconductor substrate having layers 4, 7, and 41 as well as a region 5 is provided and then the upper surface thereof is covered with an oxide film 12. The oxide film 12 is selectively etched so as to leave a portion which spans over both the layer 4 and the region 5.

(2) Then, a polycrystalline silicon layer is deposited on the upper surface of the substrate followed by removing undesired portion thereof to leave the portion which makes the layers 13 to 15. In this process, the silicon layer is not doped with impurities (in other words, this layer is undoped one).

(3) P type or n type impurities such as boron or phosphorus atoms are injected in the polycrystalline silicon layer according to selective ion-injection technique utilizing a mask to partially convert the layer to p type or n type portions. In this connection, the term "n+" means a strongly doped n type portion, that is to say, "n+" means high impurity atom concentration.

(4) The device is heated in an oxidizing atmosphere to form an oxide film thereon, and then the film is removed by etching except a portion specified by the numerical value 10.

(5) A polycrystalline silicon layer is formed together with adding impurity atoms so as to cover the device, and the silicon layer is removed by etching to leave the gate polycrystalline silicon layer 9.

(6) A layer 11 of PSG (Phospho-Silicote-Glass) is formed on the device, followed by selectively etching the PSG layer to form an aperture and forming a metal film thereon by vapor deposition. The metal film is selectively etched to form a source electrode 1 and a gate electrode 2. A metal layer is formed on the underside of the device by vapor deposition to obtain a drain electrode 3.

The MOSFET shown in FIG. 3 which comprises the N+, P, N polycrystalline silicon layers 13, 14, 15 and the gate polycrystalline silicon layer 9 formed on the gate oxide film 10 corresponds to the MOSFET 31 shown in FIG. 2. In this embodiment, the NPN transistor 33 shown in FIG. 2 is not present.

When the conductivity modulated MOSFET is in on-state by applying a voltage to the gate electrode 2, electrons move from the source electrode 1 to the N− to the N− base layer 4 through the polycrystalline silicon layers 13, 14, 15. The N type polycrystalline silicon layer 15 is designed so that it has the same order of specific resistivity as that of the N− base layer 4. If the specific resistivity of the layer 15 is not low, it does not cause to increase on-voltage. This is because the electrons can move through an accumulation layer immediately below the gate oxide layer 10 when the MOSFET is in on-state. On the other hand, positive holes move from the N− base layer 4 to the source electrode 1 through the P+ emitter region 5. As explained above, the conductivity modulated MOSFET according to the present invention makes it possible to pass electrons and positive holes through different passages, and therefore, the latch up phenomenon cannot take place.

When the MOSFET according to this embodiment is in off-state, the N+PN structure of the polycrystalline silicon layers 13 to 15 must withstand reverse voltage. Since the specific resistivity of the N layer 15 is high, the voltage can easily be withstood between the P layer 14 and N layer 15.

It is a matter of course that a mobility of the layer 13 to 15 can extremely be enhanced and the on-voltage decrease correspondingly, if the polycrystalline silicon layers which constitute the semiconductor layer of the MOSFET are converted to single crystals by annealing such as laser annealing technique, after the formation of the semiconductor layer, as is common in the SOI technique.

According to the present invention, the MOSFET included in the conductivity modulated MOSFET is separated from the bipolar transistor thereof, and is formed on a semiconductor substrate of the transistor according to SOI technique. Therefore, the passages of electrons and positive holes are completely different from another one and as a result, the conductivity modulated MOSFET in which the latch up phenomenon is never caused can be manufactured.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A conductivity modulated metal oxide semiconductor field effect transistor, comprising:
   a semiconductor substrate having a base layer of first conductivity type, a drain layer of second conductivity type formed on a first surface of said base layer, and an emitter region of the second conductivity type formed on a second surface of said base layer;
   an oxide film deposited on said substrate so that it spans over a part of a surface of said emitter region and a part of a surface of said base layer;
   a first polycrystalline silicon layer of the second conductivity type deposited so that it comes into contact with only said oxide film;
   a second polycrystalline silicon layer of the first conductivity type deposited so that it spans over said emitter region and said oxide film, and so that it comes into contact with a first side wall of said first polycrystalline silicon layer;
   a third polycrystalline silicon layer of the first conductivity type deposited so that it spans over said base region and said oxide film, and so that it comes into contact with a second side wall of said first polycrystalline silicon layer;
   a gate polycrystalline silicon layer deposited so that it spans over from said first polycrystalline silicon layer to said third polycrystalline silicon layer through an insulating layer;
   a source electrode coming into contact with said emitter region and said second polycrystalline silicon layer;
   a gate electrode coming into contact with said gate polycrystalline silicon layer; and
   a drain electrode coming into contact with said drain layer.

* * * * *